United States Patent [19]

Kurita

[11] Patent Number: 5,235,328
[45] Date of Patent: Aug. 10, 1993

[54] REMOTE COMMAND APPARATUS

[75] Inventor: Tohru Kurita, Kanagawa, Japan

[73] Assignee: Sony Corporation, Tokyo, Japan

[21] Appl. No.: 663,209

[22] Filed: Feb. 28, 1991

Related U.S. Application Data

[63] Continuation of Ser. No. 395,071, Aug. 17, 1989, abandoned.

[30] Foreign Application Priority Data

Aug. 23, 1988 [JP] Japan .............................. 63-208583

[51] Int. Cl.$^5$ .......................................... H04B 10/00
[52] U.S. Cl. ........................... 340/825.720; 358/194.1; 359/146
[58] Field of Search ...................... 340/825.69, 825.72; 358/194.1; 359/142, 143, 148, 146; 341/176, 22, 23

[56] References Cited

U.S. PATENT DOCUMENTS

| | | | |
|---|---|---|---|
| 4,623,887 | 11/1986 | Welles, II | 340/825 |
| 4,626,848 | 12/1986 | Ehlers | 358/194.1 |
| 4,722,065 | 1/1988 | Ogawa | 364/709.1 |
| 4,728,949 | 3/1988 | Platte et al. | 340/825.69 |
| 4,752,775 | 6/1988 | Rizzo | 340/825.72 |
| 4,802,114 | 1/1989 | Sogame | 340/825.72 |
| 4,890,832 | 1/1990 | Komaki | 235/146 |
| 5,028,919 | 7/1991 | Hidaka | 358/194.1 |

FOREIGN PATENT DOCUMENTS

| | | | |
|---|---|---|---|
| 0129236 | 12/1984 | European Pat. Off. | |
| 59-98227 | 6/1984 | Japan | 341/23 |
| 61-111089 | 5/1986 | Japan | |
| 0059051 | 3/1988 | Japan | 341/176 |

*Primary Examiner*—Donald J. Yusko
*Assistant Examiner*—Dervis Magistre
*Attorney, Agent, or Firm*—Lewis H. Eslinger; Jay H. Maioli

[57] ABSTRACT

The present invention relates to a commander apparatus in which control data is stored in recording media in correspondence to various switches on the commander, and the recording media are detachably enclosed in the main body of the commander. The remote commander main body comprises a receiver for receiving command signals that are supplied from the outside; a control unit for storing the control data which is obtained by demodulating the command signals supplied from the outside in correspondence to the key switches of the recording media, and interfaces for coupling the recording media with the remote commander main body. The user stores the control data in the recording media on the basis of a desired key arrangement, so that an original key arrangement according to the user can be realized. The operating efficiency can be improved without increasing the number of keys on the commander.

4 Claims, 6 Drawing Sheets

REMOTE COMMAND APPARATUS

This is a continuation of U.S. patent application Ser. No. 07/395,075, filed Aug. 17, 1989, now abandoned.

BACKGROUND OF THE INVENTION

1. Field of the Invention

The present invention relates generally to a remote control unit and, more specifically, to the key arrangement of a remote commander that is used in controlling the operation of electronic apparatus.

2. Description of the Background

In recent years, it has become common that electronic apparatus, such as television receivers, VTR's, video disc players, and the like are controlled and operated using remote commanders. The arrangement of the keys on such remote commanders is predetermined by the manufacturer so as to provide the key arrangement for that particular unit that can be most easily used by the ordinary person. Nevertheless, because of the diversification of users and manufacturers, the key arrangements which are thought to be most easily used are not uniform. For instance, in the case of a remote commander used to control the operation of a VTR, the user who executes a number of editing operations frequently uses the operation keys relating to the editing process, such as still, slow pause, etc., so it is preferable that such operation keys are arranged at easily operable positions on the remote commander. On the other hand, for the user who rarely performs tape editing it is sufficient that such operation keys are arranged at any positions on the remote commander. This latter person requires that the operation keys for recording, reproducing, and the like not necessarily associated with editing be arranged at easily operable positions on the remote commander.

Nevertheless, in conventional remote commanders known heretofore, the key arrangement cannot be easily changed in accordance with the desires and operating habits of the user.

Furthermore, a remote commander is provided in correspondence with each unit of electronic apparatus, therefore, when an audio-visual system is assembled by combining a number of electronic units, a corresponding number of remote commanders are needed.

In Japanese Laid-open Patent Application 61/111089, there has been proposed a construction in which a command signal corresponding to each apparatus can be transmitted by changing a transmission card ROM in the remote commander. By using such a remote commander, a plurality of different electronic units can be operated by use of the single remote commander by inserting the card relating to that particular unit.

Even in such a remote commander, in which a command signal corresponding to the apparatus can be transmitted by changing the transmission card ROM, the key arrangement of the transmission card ROM cannot be freely set.

There also has been proposed a remote commander with what is called a learning function, in which the command signals that are output from other remote commanders are learned, so that various kinds of electronic units can be controlled by a single remote commander. By using such a commander with the learning function, a number of electronic units can be operated by one remote commander and there is no need to use a number of remote commanders.

Nevertheless, in such a commander having the learning function, in general, the names of the commands corresponding to the keys have previously been displayed or printed on the body of the commander and the command signals are learned by the user on the basis of the printed indicia on the commander. Therefore, the key arrangement actually cannot be freely set. On the other hand, in such a commander with the learning function, the command signals of that remote commander itself cannot be changed. Furthermore, in such commander, because a plurality of electronic units are controlled by one remote commander, up to one hundred different keys may have to be arranged on the remote commander main body. Thus, the operating efficiency of such a conventional commander with the learning function is not good.

OBJECTS AND SUMMARY OF THE INVENTION

Accordingly, it is an object of the present invention to provide a remote control unit that can eliminate the above-noted defects inherent in the prior art. It is another object of the present invention to provide a commander apparatus in which the key arrangement can be freely reconfigured or set in accordance with the wishes of each user.

A further object of the present invention is to provide a commander apparatus in which the number of keys arranged on a remote commander main body are minimized and the operating efficiency is improved.

In accordance with one aspect of the present invention, there is provided a commander apparatus in which the recording media, into which control data corresponding to key switches is stored, are detachably enclosed in a remote commander main body, that comprises a receiving unit for receiving command signals that are supplied externally, a control unit for storing the control data that is obtained by demodulating the externally supplied command signals in correspondence to the key switches of the recording media, and a connector for coupling the recording media with the remote commander main body. The recording media may be one or more ROM cards or RAM cards that are detachably enclosed in a portion of the remote commander main body, so that the command data is stored in the ROM card or RAM card. The commander data of the other ROM card or RAM card can be transferred to the RAM card, and the command signals of other remote commanders can be demodulated and the resultant demodulated data stored in the RAM card.

By transferring the command data of the other ROM card or RAM card into the RAM card or by storing the command data of the other remote commander in the RAM card, a remote commander having an original key arrangement according to the requirements of the user can be realized.

The above and other objects, features, and advantages of the present invention will become readily apparent from the following detailed description thereof which is to be read in connection with the accompanying drawings in which like reference numerals represent the same or similar elements.

DETAILED DESCRIPTION OF PREFERRED EMBODIMENTS

In order to further understanding of the present invention it is described hereinbelow in the following order: (a) Overall construction of operable embodiment; (b) Circuit construction of a remote commander main body; (c) Circuit constructions of ROM card and RAM card; and (d) Method of using operable embodiment.

Figure 1:
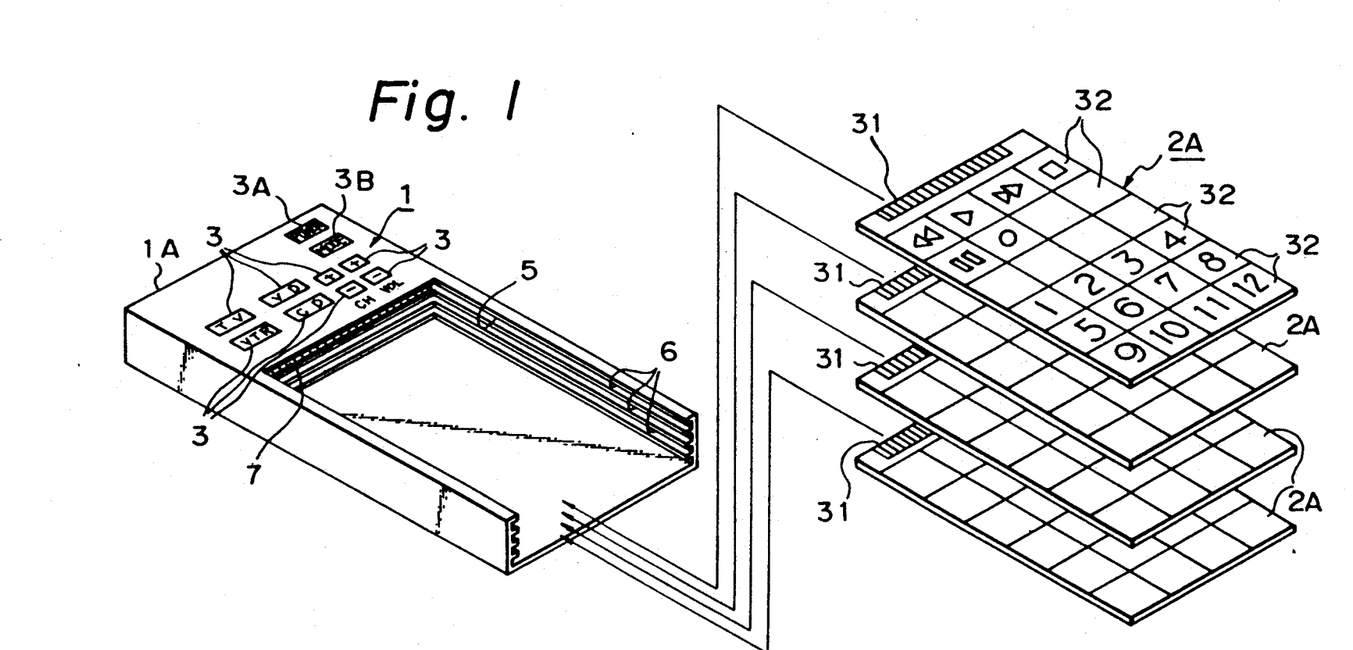
FIG. 1 is an exploded perspective view of a remote commander according to an embodiment of the present invention.

(a) Overall construction of operable embodiment:

In FIG. 1, one or more ROM cards, shown typically at 2A, are adapted to be inserted into a remote commander main body 1. As will be explained in detail below, in place of the ROM card 2A a RAM card 2B (not shown in FIG. 1) could also be inserted into commander main body 1. On remote commander main body 1 there are arranged a key switch 3A to control the on/off operation of an internal power supply; a key switch 3B to set the operational mode such as normal or control mode, learning mode, transfer mode, or the like; and various other key switches, shown generally at 3, that are used to set the necessary minimum commands, such as selection of VTR, TV, CD, setting of audio volume, setting the channel, and the like.

Figure 2:
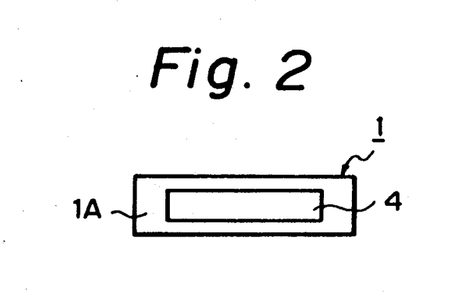
FIG. 2 is a front elevational view of the remote commander of FIG. 4.

As shown in FIG. 2, a light window 4 for transmitting and receiving infrared command signals is provided on a front end surface 1A of remote commander main body 1. In the case of learning command signals from other remote commanders, the command signals from the other remote commanders are received through the light window 4.

An open section 5 to accept one or more ROM cards 2A, or RAM cards 2B, is formed in the remote commander main body 1. In the embodiment of FIG. 1, provision is made for a plurality of, for instance four, ROM cards 2A, or RAM cards 2B, to be inserted into open section 5 of commander main body 1.

Guide grooves 6 forming a plurality of stages each having a width corresponding to a thickness of a ROM card 2A or RAM card 2B are formed along the inner peripheral surfaces of the open section 5 of remote commander main body 1. Among the plurality of stages of grooves 6, one such stage has a connector portion 7 provided at the position corresponding to the front of the top guide groove 6.

The ROM card 2A or RAM card 2B has a shape corresponding to the open section 5 formed in the remote commander main body 1. An electrical contact portion 31 is formed along the front edge of the ROM card 2A. A similar electrical contact portion is also formed along the front edge of the RAM card.

As shown in FIG. 1, each ROM card 2A, or RAM card, is inserted along the guide groove 6 from the rear of remote commander main body 1. An outer peripheral portion of ROM card 2A fits into guide groove 6, so that the appropriate card is retained in section 5 of remote commander main body 1. In the embodiment shown, four ROM cards 2A, or RAM cards, can be inserted into section 5 in correspondence to the number of stages of the guide grooves 6.

It is understood that only one such card is electrically connected to the circuitry of commander main body 1, with the other cards simply being stored for future use. Thus, among guide grooves 6 formed in section 5, connector portion 7 is formed only at the position corresponding to the top one of guide grooves 6. On the other hand, the electrical contact portions 31 are formed along the front edge of all ROM cards 2A, or RAM cards.

Therefore, among a plurality of ROM cards 2A, or RAM cards, enclosed in open section 5 of remote commander main body 1, the electrical contact portion 31 of the ROM card 2A that is enclosed in the top stage is coupled with connector portion 7 of remote commander main body 1.

Figure 3:
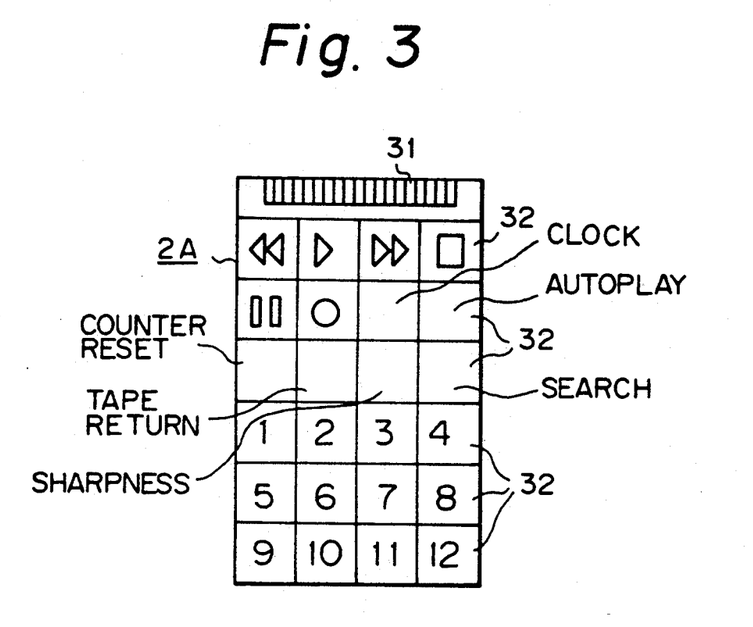
FIG. 3 is a plan view of a ROM card according to an embodiment of the present invention.

A ROM card 2A is prepared for every electronic apparatus and, as shown in FIG. 3, various key switches, shown typically at 32, are arranged on the upper surface of each card. Characters, figures, and the like corresponding to commands are already displayed on the key switches 32. The command data of the commands corresponding to the displays of key switches 32 are stored in a ROM included in ROM card 2A.

Figure 4A:
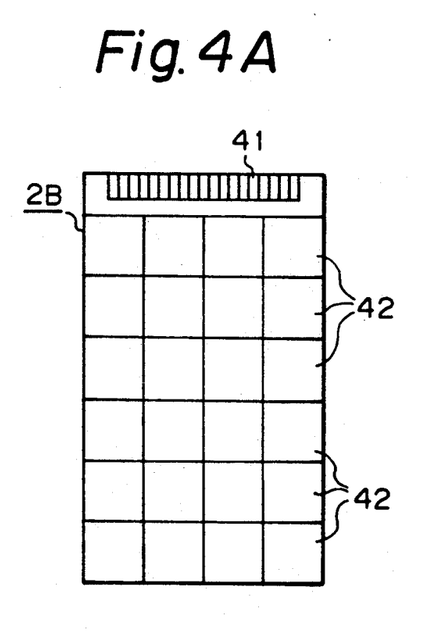
FIGS. 4A and 4B views of RAM cards according to an embodiment of the present invention.
Figure 4B:
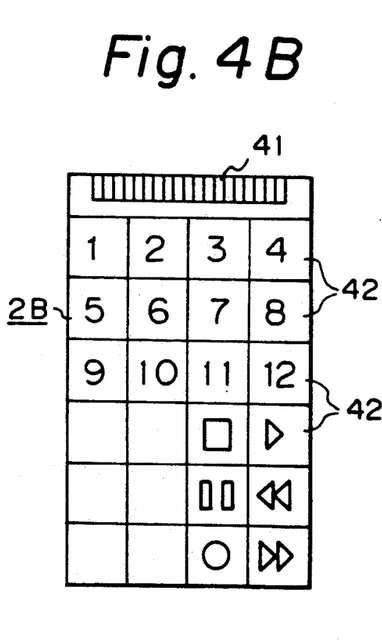

As shown in FIGS. 4A and 4B, key switches, shown typically at 42, are also provided on a RAM card 2B. In the initial state, as shown in FIG. 4A, nothing is displayed on the key switches 42. As shown in FIG. 4B, the user can freely write characters, symbols, and the like onto the key switches 42 using a pencil or pen. In the case of the RAM card 2B, the key arrangement can be determined in accordance with the wishes of the user. The command data corresponding to the key arrangement of the key switches 42 is stored in a RAM in the RAM card 2B. Note the arrangement of electrical contacts 41 along the front end of RAM card 2B for making contact with connector 7 in commander main body 1.

Figure 5:
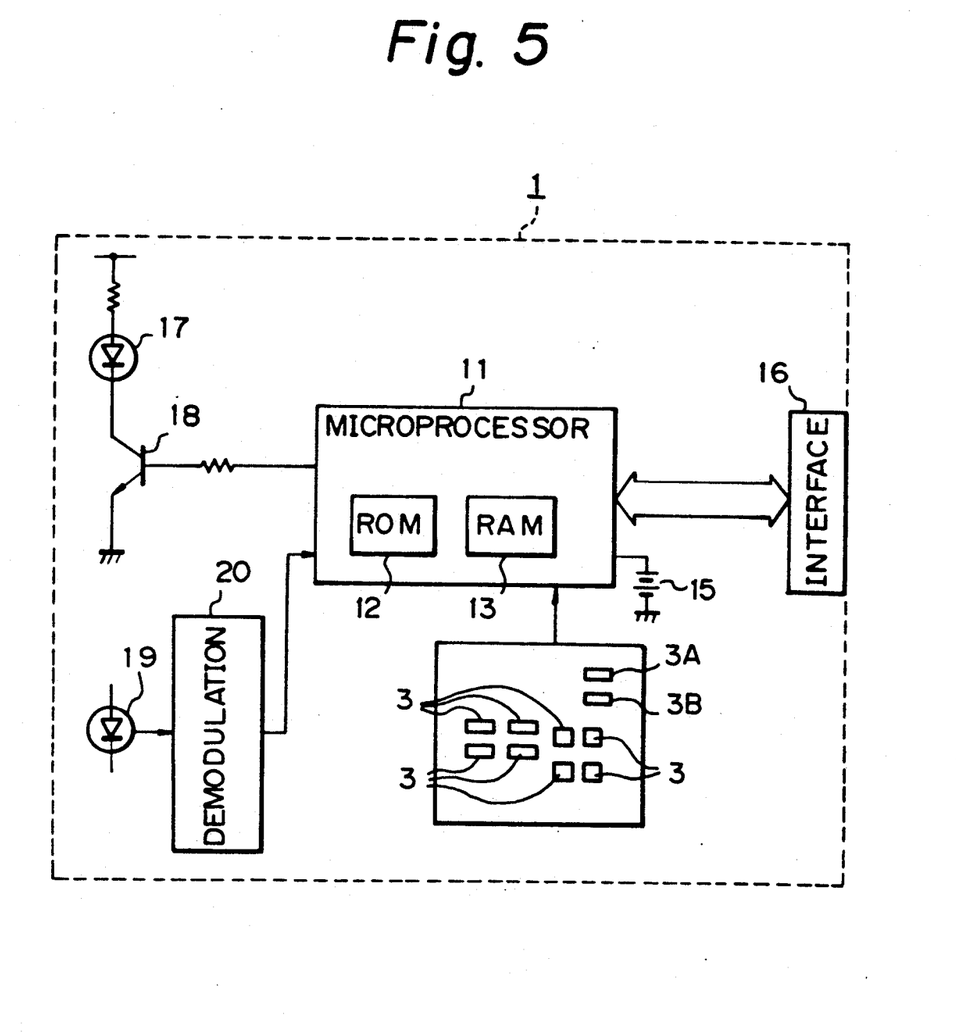
FIG. 5 is a schematic in block diagram form of the main circuitry of a remote commander according to an embodiment of the present invention.

In FIG. 1, ROM cards 2A, or RAM cards 2B, are inserted into open section 5 of remote commander main body 1, so that by pressing key switches 32 of ROM card 2A, or switches 42 of RAM card 2B, inserted at the top stage of open section 5, the infrared command signal corresponding to the depressed key switch 32 or 42 is output through light window 4, and the electronic apparatus operated by the infrared command signal. (b). Circuit construction of a remote commander main body:

As shown in FIG. 5 the remote commander includes a microprocessor 11, which is a one-chip microprocessor in which a ROM 12 and a RAM 13 are arranged in the same chip. Microprocessor 11 is driven by a power supply 15, and key switches 3, 3A, and 3B are electrically connected to microprocessor 11.

An interface 16 is provided in the remote commander main body 1, and the connector portion 7 (FIG. 1) is led out at interface 16. When a ROM card 2A or RAM card is inserted in the top stage of section 5 of remote commander main body 1, the connector portion 7 of the remote commander main body 1 is coupled with the connector portion 31 of ROM card 2A, or 41 of RAM card 2B. Data can be input/output between the ROM card 2A or RAM card 2B and the microprocessor 11 of the remote commander main body 1 through interface 16.

Figure 6:
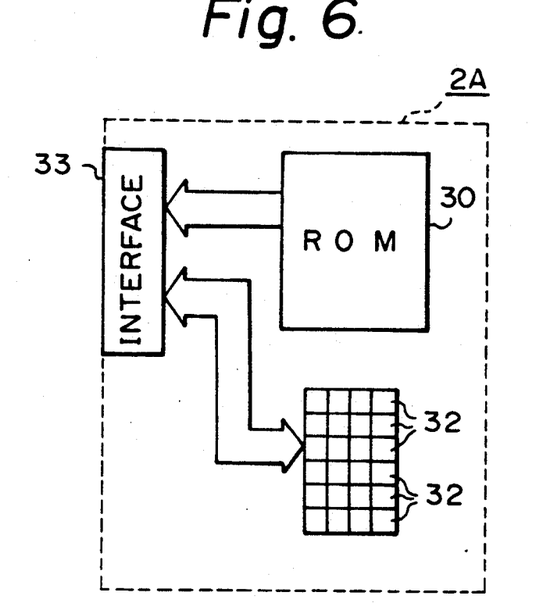
FIG. 6 is a schematic in block diagram form of a ROM card according to an embodiment of the present invention.

A light emitting device 17 receives an output of microprocessor 11 through a drive transistor 13, so that an infrared command signal is output from the light emitting device 17. On the other hand, a photo sensitive device 19 receives command signals from the other remote commanders. The command signal detected by photo sensitive device 19 is supplied to a demodulating circuit 20 and the command data is demodulated and supplied to microprocessor 11. The light emitting device 17 and photo sensitive device 19 are arranged in the light window 4 (FIG. 2) on the front surface 1A of remote commander main body 1. (c). Circuit construction of ROM card and RAM card:

The ROM card 2A as shown in FIG. 6 includes a ROM 30, and key switches 32 are arranged on the upper surface of ROM card 2A. The command data corresponding to the commands of the various key switches 32 arranged on ROM card 2A is already stored in ROM 30 at the time of manufacture of the electronic unit to which the ROM card corresponds. An interface 33 is provided for the ROM card 2A, and the connector portion 31 (FIG. 1) is led out at interface 33. When ROM card 2A is inserted in the top stage of open section 5 of remote commander main body 1, the command data stored in the ROM 30 can be transferred to microprocessor 11 on the remote commander main body 1 side through interface 33.

Figure 7:
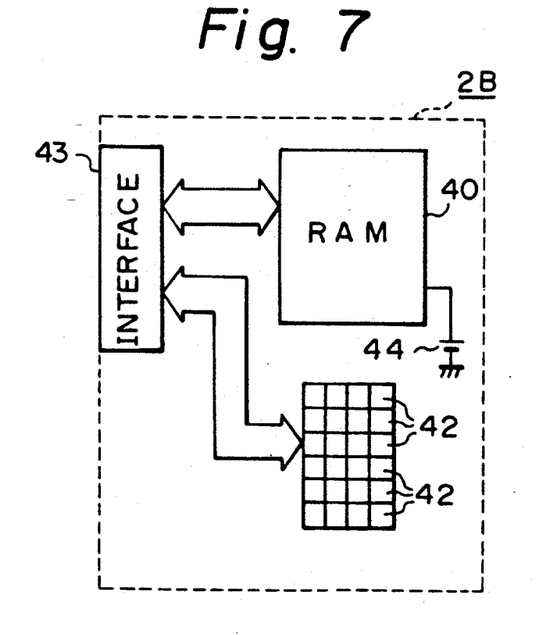
FIG. 7 is a schematic in block diagram form of a RAM card according to an embodiment of the present invention.

The RAM card 2B as shown in FIG. 7 includes a RAM 40 that has a backup power supply 44, and the key switches 42 are arranged on RAM card 2B. The command data can be stored in RAM 40 by using the key switches 42 located on the RAM card 2B, and the command data can be rewritten as necessary. An interface 43 is provided on RAM card 2B, and the connector portion 41 (FIG. 1) is led out of interface 43. When RAM card 2B is inserted in the top stage of open section 5 of remote commander main body 1, the command data stored in the RAM 40 can be transferred to microprocessor 11 of the remote commander main body 1 side through interface 43. (d). Method of using the operable embodiment.

In using the embodiment of the present invention described above, a ROM card 2A is first prepared for each individual unit of electronic apparatus to be controlled by the commander. The command data corresponding to the key arrangement has already been stored in the ROM card 2A and, therefore, the key arrangement of the ROM card 2A has been predetermined by the manufacturer and cannot be changed.

Only the necessary number of RAM cards 2B need be prepared by the user, and in the initial state, no command data at all is stored in the RAM card 2B. The command data is only stored in the RAM card 2B in accordance with the specific requirements of the user.

In this embodiment, by using the ROM cards 2A each respective electronic apparatus can be easily operated in accordance with the key arrangement that was preset by the manufacturer, in a manner similar to the use of conventional remote commanders. On the other hand, by transferring the command data stored in the ROM card 2A into the RAM card 2B, the key arrangement can be changed in accordance with the wishes of the user. Furthermore, command signals of other remote commanders can be learned by using the RAM card 2B.

For example, in the case of operating each electronic apparatus in accordance with the key arrangement that was preset by the manufacturer in a manner similar to the conventional remote commander, the ROM card 2A prepared for each different species of electronic apparatus is inserted in the top stage of open section 5 of remote commander main body 1.

As shown in FIG. 3, key switches 32 are arranged on the upper surface of ROM card 2A and characters and symbols indicative of the various operating modes are already printed on the key switches 32. The key arrangement of the ROM card 2A is set to the arrangement which can be most easily used by the ordinary user of that specific electronic apparatus. The command signals corresponding to key switches 32 have already been stored in ROM 30 (FIG. 6) of ROM card 2A.

Figure 8:
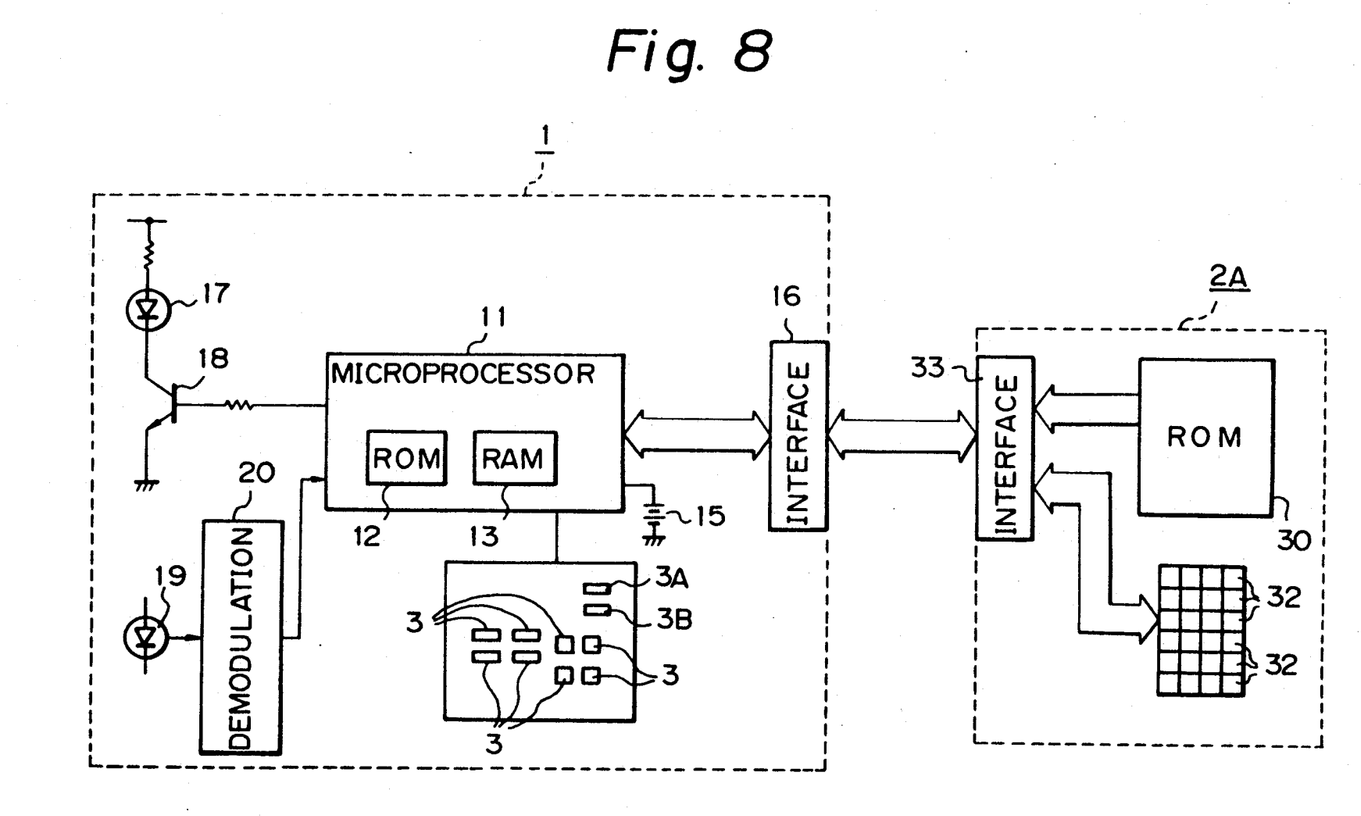
FIGS. 8 and 9 are schematics in block diagram form showing the circuits of FIGS. 6 and 7, respectively, installed in the circuit of FIG. 5.

When the ROM card 2A is inserted in the top stage of open section 5 of remote commander main body 1, connector portion 31 at the front edge portion of ROM card 2A is coupled with the connector portion 7 of remote commander main body 1. Therefore, as shown in FIG. 8, data can be transmitted and received between ROM 30 in the ROM card 2A and microprocessor 11 of remote commander main body 1 through interface 33 of the ROM card 2A and interface 16 of the remote commander main body 1.

When one of key switches 32 arranged on ROM card 2A is pressed, the corresponding command data is read out of ROM 30 and sent to microprocessor 11. A command signal is formed by microprocessor 11 on the basis of that command data, and an output of microprocessor 11 is supplied to light emitting device 17 through driver 18, so that an infrared command signal based on the command signal is output from light emitting device 17 through light window 4.

As mentioned above, the command data has already been stored in the ROM card 2A so as to provide the key arrangement which can be most easily used by the ordinary person. Therefore, by using ROM card 2A, the electronic apparatus can be operated by operations similar to those of the conventional remote commander without needing any complicated instructions.

Even though the key arrangement of the ROM card 2A has been predetermined, if the user feels it difficult to operate the keys in such arrangement, the key arrangement may be changed and the command data of the ROM card 2A transferred to the RAM card 2B.

The following operations are executed in the case of transferring the command data stored in the ROM card 2A to the RAM card 2B.

In the case where the command data stored in ROM card 2A is transferred to the RAM card 2B, the ROM card 2A containing the information to be transferred is first inserted in the top stage of open section 5 of remote commander main body 1, so that the connector portion 31 along the front edge of ROM card 2A is coupled with connector portion 7 of remote commander main body 1. Therefore, as seen from FIG. 8, data can be transmitted and received between ROM 30 in ROM card 2A and microprocessor 11 of the remote commander main body 1 through interface 33 of ROM card 2A and interface 16. When ROM card 2A is inserted in the top stage of open section 5, the transfer mode is set by operating key switch 3B on commander main body 1.

Figure 9:
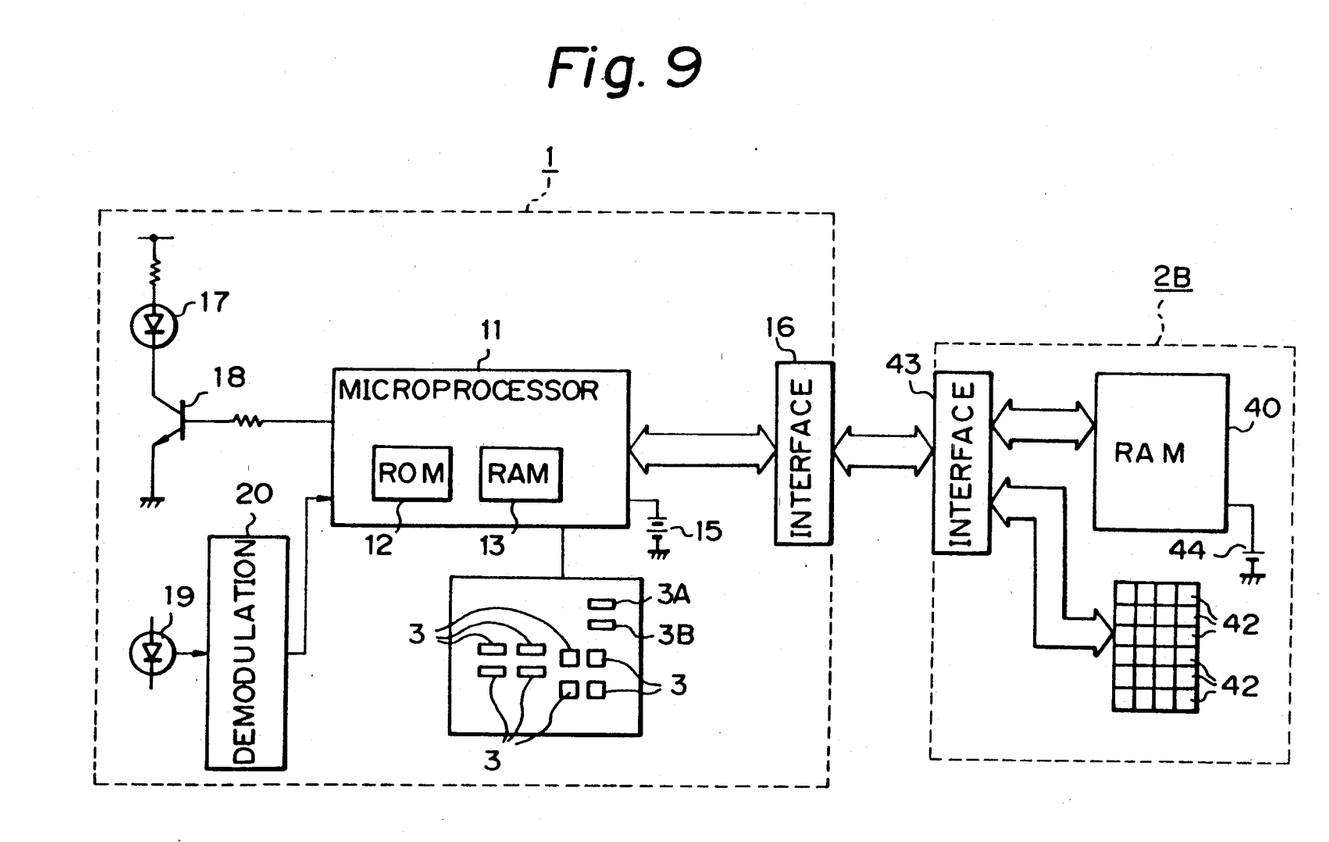

By pressing various key switches 32 arranged on ROM card 2A, the command data corresponding to key switches 32 is read out. In the transfer mode, when the command data stored in ROM card 2A is read out, the command data is temporarily stored in RAM 13 of the microprocessor 11 and ROM card 2A is removed from the top stage of open section 5. In place of this card, RAM card 2B to which the command data will be transferred is inserted into the top stage of open section 5, and connector 41 along the front edge of RAM card 2B is coupled with connector portion 7 of remote commander main body 1. Therefore, as shown in FIG. 9, data can be transmitted and received between RAM 40 in RAM card 2B and microprocessor 11 of remote commander main body 1 through interface 43 of the RAM card 2B and the interface 16.

Among the key switches 42 arranged on RAM card 2B, key switch 42 at the position suitable to execute the operation of such a command is pressed. By doing this the command data of ROM card 2A, which has temporarily been stored in RAM 13 of microprocessor 11 of remote commander main body 1, is stored in RAM 40 in RAM card 2B in correspondence to the particular key switch 42 pressed at that time. Thus, the command data stored originally in the ROM card 2A is transferred to RAM card 2B. After the command data is stored in RAM card 2B, the characters and symbols corresponding to the various commands can be written with pencil or pen onto key switches 42 on the upper surface of RAM card 2B.

By an operation similar to that described above, command data can be also transferred between one RAM card 2B and another RAM card 2B.

By storing the command data of the ROM card 2A into the RAM card 2B, a remote commander having any original key arrangement according to the user's requirements can be realized.

There is also the case where an audio-visual system is constructed using electronic apparatus from various manufacturers, in which the remote commanders of the electronic apparatus of the other companies do not have such ROM cards 2A. In such a case, therefore, the command data of the other remote commanders are learned and the command data of the other remote commanders are stored into the RAM cards 2B. The following operations are executed in the case of learning the command signals of another remote commander.

In the case of learning the command signals of another remote commander, a RAM card 2B is inserted into the top stage of open section 5 of commander main body 1, and the learning mode is set by operating key switch 3B. The arrangements where the RAM card 2B is inserted into the top stage of the open section 5 of commander main body 1 is shown in FIG. 9.

When RAM card 2B is in the top stage of open section 5 of commander main body 1 and the learning mode is set by key switch 3B, the other remote commander is arranged such that its light emitting section is close to the light window 4 at the front side 1A of remote commander main body 1.

The operation key switch of the other remote commander is pressed and the appropriate key switch 42 of RAM card 2B is also pressed. When the operation key switch of the other remote commander is pressed, an infrared command signal is output from the remote commander and is detected by the photosensitive device 19 and is demodulated by demodulating circuit 20.

The demodulated command data is supplied to microprocessor 11, and the command data is sent to RAM 40 of RAM card 2B through interfaces 16 and 43 and stored into RAM 40 of RAM card 2B.

When the learning mode is set as mentioned above, the command data of the remote commander of another manufacturer can be stored in RAM 40 of RAM card 2B. If the command data of the remote commander of another company is stored in RAM 40 of RAM card 2B, even in the case of constructing an audio-visual system by combining various items of electronic apparatus of other companies, such plurality of electronic apparatus can be operated by one remote commander. Since various kinds of electronic apparatus can be operated by merely exchanging the RAM card 2B, there is no need to increase the number of key switches on the remote commander main body 1. Thus, the operating efficiency is good.

According to the present invention, the command data is stored in the card-shaped ROM card 2A or RAM card 2B that is detachably retained in the remote commander main body 1.

The command data of the other ROM card 2A or RAM card 2B can be transferred to the RAM card 2B and by transferring the command data of the other ROM card 2A or RAM card 2B as mentioned above, a remote commander having a key arrangement wholly original to the user can be realized.

On the other hand, the command data of another remote commander can be learned and the command data can be stored into the RAM card 2B. In this manner, since the command signals of the remote commander can be learned, even in the case of constructing an audio-visual system by collecting electronic apparatus of other companies, the assembled apparatus can be operated by one remote commander.

Since the command data of various kinds of electronic apparatuses are stored on every RAM card 2B, the number of keys on the remote commander 1 is not increased. Therefore, the operating efficiency is good.

On the other hand, because a plurality of guide grooves 6 are formed in the opening portion 5 of the remote commander main body 1, the ROM cards 2A or RAM cards 2B not presently in use can be stored in the opening portion 5.

Having described a specific preferred embodiment of the present invention with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A reconfigurable commander apparatus for remote control of one or more electronic devices, said commander apparatus comprising;
    a main body; a ROM card detachably mounted in the main body and including actuatable key switches and in which a plurality of units of control data are stored in such a manner that a particular key switch corresponds to a particular unit of control data;
    a RAM card detachably mounted in the main body and including actuatable key switches and in which control data can be stored corresponding to key switches to be determined by a user;
    microprocessor means including temporary storage means permanently mounted in the main body; and interface means by which said ROM card and said RAM card can be selectively coupled electrically to said microprocessor means and said temporary storage means;

whereby said ROM card can be coupled electrically to said microprocessor means and said temporary storage means for transferring said plurality of units of control data to said temporary storage means; and said RAM card can then be coupled electrically to said microprocessor means and said temporary storage means for transferring said plurality of units of control data from said temporary storage means to said RAM card in such a manner that the user can cause any of said key switches in said RAM card to correspond to any of said units of control data.

2. A reconfigurable commander apparatus enabling a user to effect remote control of one or more electronic devices, said commander apparatus comprising:

control means;

random access memory means coupled to said control means and formed with a plurality of user actuatable key switches and a corresponding plurality of storage locations, each of said key switches corresponding to a separate one of said storage locations;

user actuatable mode switch means coupled to said control means for selectively setting said commander apparatus in a learning mode or a control mode;

receiving means coupled to said control means for receiving command signals supplied externally; and transmitting means connected to said control means for transmitting command signals from said random access memory means to one or more electronic devices;

said commander apparatus
  (i) in said learning mode conveying received command signals from said receiving means to said random access memory means and said random access memory means respectively storing a plurality of said received command signals in a plurality of storage locations, said storage locations respectively corresponding to different ones of said switches in accordance with selective actuation of said switches by the user of said commander apparatus; and
  (ii) in said control mode conveying said signals stored in said storage locations to said transmitting means in accordance with selectively actuated ones of said switches for control of one or more of said electronic devices;

whereby any selected command signal can be associated with any of aid key switches in the discretion of the user of said commander apparatus.

3. A reconfigurable apparatus as claimed in claim 2 further comprising a main body, said control means, mode switch means, receiving means and transmitting means being connected to said main body and said random access memory means being detachably connected to said main body.

4. A reconfigurable apparatus as claimed in claim 3 wherein said main body is formed with a plurality of stages of grooves facilitating slidable insertion of said random access memory means within and removal of said random access memory means from said main body.

* * * * *

UNITED STATES PATENT AND TRADEMARK OFFICE
CERTIFICATE OF CORRECTION

PATENT NO. : 5,235,328
DATED : August 10, 1993
INVENTOR(S) : Tohru Kurita

It is certified that error appears in the above-indentified patent and that said Letters Patent is hereby corrected as shown below:

```
Col. 3, line 5, after "4B" insert --are plan--
Col. 4, line 56, "(b)." should start a new paragraph
        on next line
Col. 5, line 19, "(c)." should start a new paragraph
        on next line
        line 47, "(d)." should start a new paragraph
        on next line Col. 8, line 58, "a ROM" should start on next line
Col. 10, line 22, change "aid" to --said--
```

Signed and Sealed this

Thirteenth Day of June, 1995

Attest:

BRUCE LEHMAN

Attesting Officer

Commissioner of Patents and Trademarks